(12) United States Patent
Kwag et al.

(10) Patent No.: US 9,258,893 B2
(45) Date of Patent: Feb. 9, 2016

(54) MULTILAYER CERAMIC ELECTRONIC PART AND BOARD HAVING THE SAME MOUNTED THEREON

(71) Applicant: SAMSUNG ELECTRO-MECHANICS CO., LTD., Suwon-Si, Gyeonggi-Do (KR)

(72) Inventors: Joon Hwan Kwag, Suwon-Si (KR); Jae Sung Park, Suwon-Si (KR); Sang Huk Kim, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 161 days.

(21) Appl. No.: 14/198,172

(22) Filed: Mar. 5, 2014

(65) Prior Publication Data

US 2015/0162132 A1  Jun. 11, 2015

(30) Foreign Application Priority Data

Dec. 5, 2013 (KR) .................. 10-2013-0150825

(51) Int. Cl.
| | |
|---|---|
| *H01G 4/248* | (2006.01) |
| *H05K 1/11* | (2006.01) |
| *H01G 4/008* | (2006.01) |
| *H05K 1/18* | (2006.01) |
| *H01G 4/30* | (2006.01) |
| *H01G 4/012* | (2006.01) |
| *H01G 4/232* | (2006.01) |
| *H05K 3/34* | (2006.01) |

(52) U.S. Cl.
CPC ............ *H05K 1/111* (2013.01); *H01G 4/232* (2013.01); *H01G 4/2325* (2013.01); *H01G 4/30* (2013.01); *H05K 1/181* (2013.01); *H05K 3/3442* (2013.01); *H05K 2201/10015* (2013.01)

(58) Field of Classification Search
CPC ......... H01G 4/248; H01G 4/30; H01G 4/012; H01G 4/008; H05K 1/181; H05K 1/111; H05K 2201/10015
USPC .......................................... 174/260; 361/306.1
See application file for complete search history.

(56) References Cited

U.S. PATENT DOCUMENTS

| | | | |
|---|---|---|---|
| 9,019,690 B2* | 4/2015 | Hong ..................... | H01G 4/008 361/301.2 |
| 2013/0170095 A1* | 7/2013 | Oh .......................... | H01G 4/008 361/305 |

FOREIGN PATENT DOCUMENTS

| | | |
|---|---|---|
| JP | 2004-103927 A | 4/2004 |
| JP | 2004-128328 A | 4/2004 |

(Continued)

*Primary Examiner* — Timothy Thompson
*Assistant Examiner* — Charles Pizzuto
(74) *Attorney, Agent, or Firm* — McDermott Will & Emery LLP

(57) ABSTRACT

There is provided a multilayer ceramic electronic part including: a ceramic body including dielectric layers; an active layer including a plurality of first and second internal electrodes formed to be alternately exposed to both end surfaces of the ceramic body; upper and lower cover layers formed on upper and lower portions of the active layer; and first and second external electrodes formed on both end portions of the ceramic body, wherein the first external electrode includes a first base electrode, a first conductive layer formed on the first base electrode at a corner portion of the ceramic body, and the second external electrode includes a second base electrode, a second conductive layer formed on the second base electrode at a corner portion of the ceramic body, the first and second conductive layers being positioned outside the active layer in a thickness direction of the ceramic body.

13 Claims, 11 Drawing Sheets

(56) References Cited

FOREIGN PATENT DOCUMENTS

| JP | 2004356333 A | * | 12/2004 |
| JP | 2007115755 A | * | 5/2007 |
| JP | 2008-181956 A | | 8/2008 |
| JP | 2013161872 A | * | 8/2013 |

* cited by examiner

MULTILAYER CERAMIC ELECTRONIC PART AND BOARD HAVING THE SAME MOUNTED THEREON

CROSS-REFERENCE TO RELATED APPLICATION

This application claims the benefit of Korean Patent Application No. 10-2013-0150825 filed on Dec. 5, 2013, with the Korean Intellectual Property Office, the disclosure of which is incorporated herein by reference.

BACKGROUND

The present disclosure relates to a multilayer ceramic electronic part capable of having improved reliability by improving corner coverage performance of an external electrode, and a board having the same mounted thereon.

In accordance with the recent trend toward miniaturization of electronic products, the demand for multilayer ceramic electronic parts having a small size and high capacitance has increased.

In accordance with the demand for multilayer ceramic electronic parts having a small size and large capacitance, external electrodes of multilayer ceramic electronic parts have also been thinned.

According to the related art, generally copper is used as a conductive metal in order to form external electrodes, an external electrode paste is prepared by mixing glass, a base resin, an organic solvent, and the like, with this metal, the external electrode paste is applied to both end surfaces of ceramic bodies. Then, the metal in the external electrodes is sintered by sintering the ceramic bodies.

The external electrode paste contains a conductive metal such as copper (Cu) as a main material to thereby ensure a chip sealing property and electrical conductivity between the external electrodes and chips, and contains glass as an auxiliary material to thereby serve to provide adhesion between external electrodes and chips simultaneously with filling an empty space at the time of sintering shrinkage of the metal.

However, as the multilayer ceramic electronic parts are miniaturized and have large capacitance, in order to secure the capacitance, a design for increasing the number of stacked internal electrodes and decreasing thicknesses of upper and lower cover layers has been generally applied.

Therefore, internal electrodes are formed to the vicinity of corner portions of the ceramic bodies at which a thickness is decreased at the time of forming external electrodes, such that the multilayer ceramic electronic parts may be easily exposed to physical or chemical impacts.

For example, as external electrodes of multilayer ceramic electronic parts have been thinned, thicknesses of the external electrodes in the vicinity of the corner portions of the ceramic bodies have been further decreased to reduce corner coverage performance. Therefore, a problem such as infiltration of a plating solution may occur.

Further, in the case of external electrodes used in high capacitance electronic parts, at the time of sintering the external electrodes, in order to decrease thermal impacts, a material capable of being sintered at a relatively low temperature may be used. For example, in the case of glass softened at a relatively low temperature, the external electrodes have relatively weak acid resistance at the time of plating. Due to these features, in the case in which plating layers are formed on outer portions of external electrodes, the plating solution may easily infiltrate, which becomes a main cause of deteriorating product quality due to deterioration of moisture resistance reliability.

RELATED ART DOCUMENT

Japanese Patent Laid-open Publication No. 2004-128328

SUMMARY

An aspect of the present disclosure may provide a multilayer ceramic electronic part having improved reliability by improving corner coverage performance of an external electrode, and a board having the same mounted thereon.

According to an aspect of the present disclosure, a multilayer ceramic electronic part may include: a ceramic body including dielectric layers; an active layer including a plurality of first and second internal electrodes formed to be alternately exposed to both end surfaces of the ceramic body, having the dielectric layer therebetween, to thereby form capacitance; upper and lower cover layers formed on upper and lower portions of the active layer; and first and second external electrodes formed on both end portions of the ceramic body, wherein in a cross section of the ceramic body in a length-thickness direction, the first external electrode includes a first base electrode, a first conductive layer formed on the first base electrode at a corner portion of the ceramic body, and a first terminal electrode formed on the first base electrode and the first conductive layer, and the second external electrode includes a second base electrode, a second conductive layer formed on the second base electrode at a corner portion of the ceramic body, and a second terminal electrode formed on the second base electrode and the second conductive layer, the first and second conductive layers being positioned outside the active layer in a thickness direction of the ceramic body.

Regions of the first and second base electrodes in which the first and second conductive layers are not formed may have a tetragonal shape when viewed in a direction of an end surface of the ceramic body.

The first and second base electrodes may contain one or more conductive metals selected from a group consisting of copper (Cu), nickel (Ni), silver (Ag), and sliver-palladium (Ag—Pd), and glass.

The first and second conductive layers may contain a larger amount of a conductive metal and a smaller amount of glass as compared to the first and second base electrodes.

The first and second conductive layers may contain a conductive resin.

The conductive resin may contain one or more conductive metals selected from a group consisting of copper (Cu), nickel (Ni), silver (Ag), and sliver-palladium (Ag—Pd), and an epoxy resin.

According to another aspect of the present disclosure, a multilayer ceramic electronic part may include: a ceramic body including dielectric layers; an active layer including a plurality of first and second internal electrodes formed to be alternately exposed to both end surfaces of the ceramic body, having the dielectric layer therebetween, to thereby form capacitance; upper and lower cover layers formed on upper and lower portions of the active layer; and first and second external electrodes formed on both end portions of the ceramic body, wherein in a cross section of the ceramic body in a length-thickness direction, the first external electrode includes a first base electrode, a first conductive layer formed on the first base electrode at a corner portion of the ceramic body, and a first terminal electrode formed on the first base electrode and the first conductive layer, and the second external electrode includes a second base electrode, a second conductive layer formed on the second base electrode at a corner portion of the ceramic body, and a second terminal electrode formed on the second base electrode and the second conductive layer, the first and second base electrodes containing a conductive metal and glass, and the first and second conductive layers containing a larger amount of a conductive metal and a smaller amount of glass as compared to the first and second base electrodes.

Regions of the first and second base electrodes in which the first and second conductive layers are not formed may have a tetragonal shape when viewed in a direction of an end surface of the ceramic body.

The conductive metal may be one or more selected from a group consisting of copper (Cu), nickel (Ni), silver (Ag), and sliver-palladium (Ag—Pd).

According to another aspect of the present disclosure, a board having a multilayer ceramic capacitor mounted on the board may include: a printed circuit board having first and second electrode pads formed on the printed board; and the multilayer ceramic electronic part as described above mounted on the printed circuit board.

Regions of the first and second base electrodes in which the first and second conductive layers are not formed may have a tetragonal shape when viewed in a direction of an end surface of the ceramic body.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
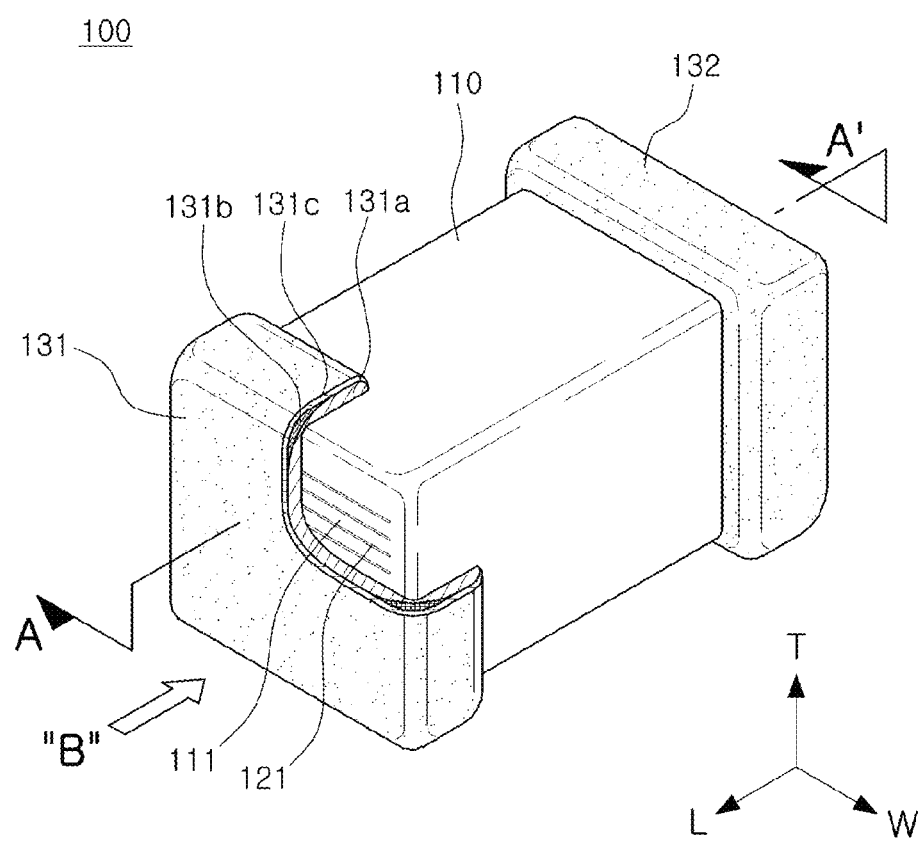
FIG. 1 is a perspective view schematically showing a multilayer ceramic capacitor according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a perspective view schematically showing a multilayer ceramic capacitor according to an exemplary embodiment of the present disclosure.

Figure 2:
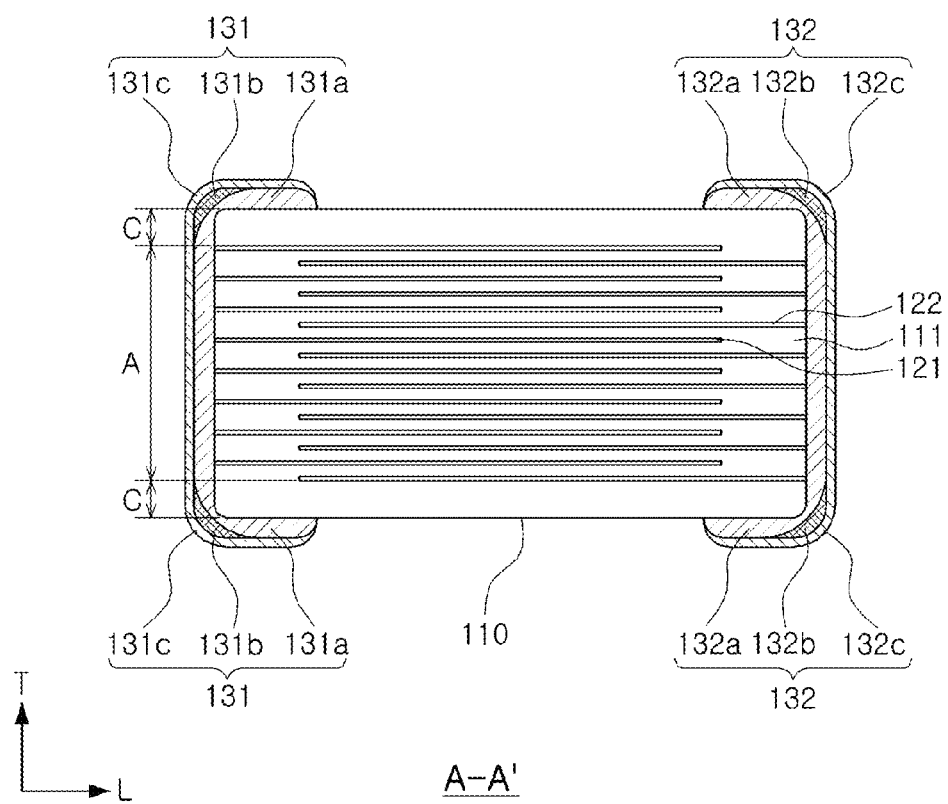
FIG. 2 is a cross-sectional view taken along line A-A' of FIG. 1.

FIG. 2 is a cross-sectional view taken along line A-A' of FIG. 1.

Referring to FIGS. 1 and 2, a multilayer ceramic electronic part according to an exemplary embodiment of the present disclosure may include: a ceramic body 110 including dielectric layers 111; an active layer A including a plurality of first and second internal electrodes 121 and 122 formed to be alternately exposed to both end surfaces of the ceramic body 110, having the dielectric layer 111 therebetween, to thereby form capacitance; upper and lower cover layers C formed on upper and lower portions of the active layer A; and first and second external electrodes 131 and 132 formed on both end portions of the ceramic body 110, wherein in a cross section of the ceramic body 110 in a length-thickness (L-T) direction, the first external electrode 131 includes a first base electrode 131a, a first conductive layer 131b formed on the first base electrode 131a at a corner portion of the ceramic body 110, and a first terminal electrode 131c formed on the first base electrode 131a and the first conductive layer 131b, and the second external electrode 132 includes a second base electrode 132a, a second conductive layer 132b formed on the second base electrode 132a at the corner portion of the ceramic body 110, and a second terminal electrode 132c formed on the second base electrode 132a and the second conductive layer 132b, the first and second conductive layers 131b and 132b being positioned outside the active layer A in a thickness direction of the ceramic body 110.

Hereinafter, the multilayer ceramic electronic part according to an exemplary embodiment of the present disclosure will be described. For example, a multilayer ceramic capacitor will be described, but the present disclosure is not limited thereto.

In the multilayer ceramic capacitor 100 according to an exemplary embodiment of the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' may be the same direction as a direction in which dielectric layers are stacked, for example, the 'stacking direction'.

In an exemplary embodiment of the present disclosure, a shape of the ceramic body 110 is not particularly limited, but may be a hexahedral shape as shown in FIG. 1.

In an exemplary embodiment of the present disclosure, the ceramic body 110 may have the first and second main surfaces opposing each other, the first and second side surfaces opposing each other, and the first and second end surfaces opposing each other, wherein the first and second main surfaces may be indicated as the upper and lower surfaces of the ceramic body 110, respectively.

According to an exemplary embodiment of the present disclosure, a raw material forming the dielectric layer 111 is not particularly limited as long as sufficient capacitance may be obtained, but may be, for example, barium titanate (BaTiO$_3$) powder.

In addition to the powder such as barium titanate (BaTiO$_3$) powder, or the like, various ceramic additives, organic solvents, plasticizers, binders, dispersing agents, or the like, may be added to the material forming the dielectric layer 111 according to the purpose of the present disclosure.

This ceramic body 110 may include the active layer A as a part contributing to formation of capacitance of the capacitor, and the upper and lower cover layers C formed on and beneath the active layer A, respectively, as upper and lower margin parts.

The active layer A may be formed by repeatedly stacking the plurality of first and second internal electrodes 121 and 122 so as to have the dielectric layer 111 therebetween.

The upper and lower cover layers C may have the same material and configuration as those of the dielectric layer 111 except that internal electrodes are not included therein.

The upper and lower cover layers C may be formed by stacking a single dielectric layer or two or more dielectric layers on upper and lower surfaces of the active layer A in a vertical direction, respectively, and may generally serve to prevent the internal electrode from being damaged by physical or chemical stress.

A material forming the first and second internal electrodes 121 and 122 is not particularly limited, but may be a conductive paste made of one or more of, for example, silver (Ag), lead (Pb), platinum (Pt), nickel (Ni), and copper (Cu).

The multilayer ceramic capacitor according to an exemplary embodiment of the present disclosure may include the first and second external electrode 131 and 132 formed on both end portions of the ceramic body 110 and electrically connected to the first and second internal electrodes 121 and 122.

The first and second external electrodes 131 and 132 may be electrically connected to the first and second internal electrodes in order to form capacitance.

In the cross section of the ceramic body in the length-thickness (L-T) direction, the first external electrode 131 may include the first base electrode 131a, the first conductive layer 131b formed on the first base electrode 131a at the corner portion of the ceramic body 110, and the first terminal electrode 131c formed on the first base electrode 131a and the first conductive layer 131b.

Further, the second external electrode 132 may include the second base electrode 132a, the second conductive layer 132b formed on the second base electrode 132a at the corner portion of the ceramic body 110, and the second terminal electrode 132c formed on the second base electrode 132a and the second conductive layer 132b.

Meanwhile, the first and second conductive layers 131b and 132b may be positioned outside the active layer A in the thickness direction of the ceramic body 110.

Hereinafter, a structure of the first and second external electrodes 131 and 132 will be described in detail.

The first and second base electrodes 131a and 132a may contain one or more conductive metals selected from a group consisting of copper (Cu), nickel (Ni), silver (Ag), and sliver-palladium (Ag—Pd), and glass.

In order to form capacitance, the first and second external electrodes 131 and 132 may be formed on both end surfaces of the ceramic body 110, and the first and second base electrodes 131a and 132a included in the first and second external electrodes 131 and 132 may be electrically connected to the first and second internal electrodes 121 and 122.

The first and second base electrodes 131a and 132a may be formed of the same conductive material as that of the first and second internal electrodes 121 and 122, but are not limited thereto. For example, the first and second base electrodes 131a and 132a may contain one or more conductive metals selected from a group consisting of copper (Cu), silver (Ag), nickel (Ni), and silver-palladium (Ag—Pd).

The first and second base electrodes 131a and 132a may be formed by applying a conductive paste prepared by adding glass frits to the conductive metal powder and then sintering the applied conductive paste.

According to an exemplary embodiment of the present disclosure, the first and second external electrodes 131 and 132 may include the first conductive layer 131b formed on the first base electrode 131a at the corner part of the ceramic body 110 and the second conductive layer 132b formed on the second base electrode 132a at the corner part of the ceramic body 110, respectively.

The first and second conductive layers 131b and 132b are formed on the first and second base electrodes 131a and 132a at the corner part of the ceramic body 110, such that the internal electrodes may be protected from the outside.

As the multilayer ceramic electronic part is miniaturized and has large capacitance, in order to secure capacitance, a design for increasing the number of stacked internal electrodes and decreasing thicknesses of upper and lower cover layers has been generally applied.

Therefore, the internal electrode is formed to the vicinity of a corner part of the ceramic body at which a thickness is decreased at the time of forming the external electrode, such that the ceramic body may be easily exposed to physical or chemical impacts.

As the external electrode of the multilayer ceramic electronic part is relatively thinned, a thickness of the external electrode in the vicinity of the corner part of the ceramic body is further decreased, such that corner coverage performance may be decreased. Therefore, a plating solution may infiltrate thereinto.

Further, in the case of an external electrode used in a high capacitance type electronic part, at the time of sintering the external electrode, in order to decrease thermal impact, a material capable of being sintered at a relatively low temperature is used. For example, in the case of glass softened at a low temperature, the external electrode has relatively weak acid resistance at the time of plating. Due to these features, in the case in which a plating layer is formed on an outer portion of the external electrode, the plating solution may easily infiltrate, which becomes a main cause of product quality deterioration caused by moisture resistance reliability deterioration.

According to an exemplary embodiment of the present disclosure, the first and second conductive layers 131b and 132b are formed on the corner part of the ceramic body, thereby preventing moisture resistance reliability from being deteriorated due to infiltration of the plating solution without increasing the thickness of the first and second external electrodes 131 and 132.

For example, the first and second conductive layers 131b and 132b are formed to be positioned outside the active layer A in the thickness direction of the ceramic body, such that reliability may be improved without increasing the thickness of the first and second external electrodes 131 and 132.

Generally, in order to solve the problem in which moisture resistance reliability is deteriorated due to a relatively reduced thickness of an external electrode formed at a corner part of a ceramic body, a method of performing double application of an external electrode paste has been used. However, in this case, the entire thickness of the external electrode may be increased, such that a problem may occur in terms of realizing the miniaturization of a product.

However, according to the exemplary embodiment of the present disclosure, the first and second conductive layers 131b and 132b are formed on the corner parts of the ceramic body, to be positioned outside the active layer A in the thickness direction of the ceramic body 110, such that the entire thickness of the external electrode may be maintained without being increased.

For example, the first and second conductive layers 131b and 132b are formed on the corner parts of the ceramic body so that one end portions thereof are positioned in a region corresponding to an outer side of the active layer A, for example, a region corresponding to the cover layer C, such that the entire thickness of the external electrode may not be increased.

The first and second conductive layers 131b and 132b may contain a larger amount of a conductive metal and a smaller amount of glass as compared to the first and second base electrodes 131a and 132a.

For example, the first and second conductive layers 131b and 132b may contain one or more conductive metals selected from a group consisting of copper (Cu), nickel (Ni), silver (Ag), and sliver-palladium (Ag—Pd), and glass similarly to those of the base electrodes 131a and 132a, but the contents are different from those of the base electrodes 131a and 132a.

Since the first and second conductive layers 131b and 132b contain a larger amount of a conductive metal and a smaller amount of glass as compared to the first and second base electrodes 131a and 132a, the multilayer ceramic capacitor having excellent reliability may be implemented by improving corner coverage performance of the external electrode to thereby prevent a moisture resistance property from being deteriorated by infiltration of the plating solution.

For example, since the first and second conductive layers 131b and 132b are formed to prevent the plating solution from easily infiltrating thereinto due to a thin thickness of the first and second base electrodes 131a and 132a formed on the corner parts of the ceramic body 110, in order to relatively further improve an effect of preventing infiltration of the plating solution, the first and second conductive layers 131b and 132b may contain a larger amount of conductive metal as compared to the first and second base electrodes 131a and 132a.

Similarly, in order to further improve an effect of preventing infiltration of the plating solution, the first and second conductive layers 131b and 132b may contain a smaller amount of glass as compared to the first and second base electrodes 131a and 132a.

According to another exemplary embodiment of the present disclosure, the first and second conductive layers 131b and 132b may contain a conductive resin, but are not necessarily limited thereto.

The conductive resin is not particularly limited, but may contain, for example, one or more conductive metals selected from a group consisting of copper (Cu), nickel (Ni), silver (Ag), and sliver-palladium (Ag—Pd), and an epoxy resin.

Meanwhile, the first external electrode 131 may include the first terminal electrode 131c formed on the first base electrode 131a and the first conductive layer 131b, and the second external electrode may include the second terminal electrode 132c formed on the second base electrode 132a and the second conductive layer 132b.

The first and second terminal electrodes 131c and 132c may be formed by plating. For example, the first and second terminal electrodes 131b and 132b may be nickel/tin plating layers, but are not necessarily limited thereto.

FIGS. 3A through 3F are schematic views showing each of the layers of first and second external electrodes when viewed in a B direction of FIG. 1.

Figure 3A:
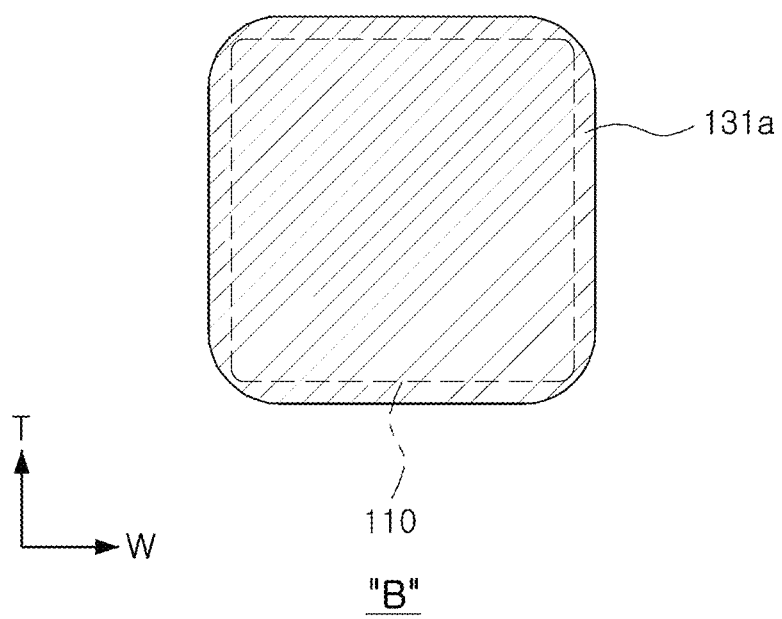
FIGS. 3A through 3F are schematic views illustrating respective layers of first and second external electrodes when viewed in a B direction of FIG. 1.
Figure 3B:
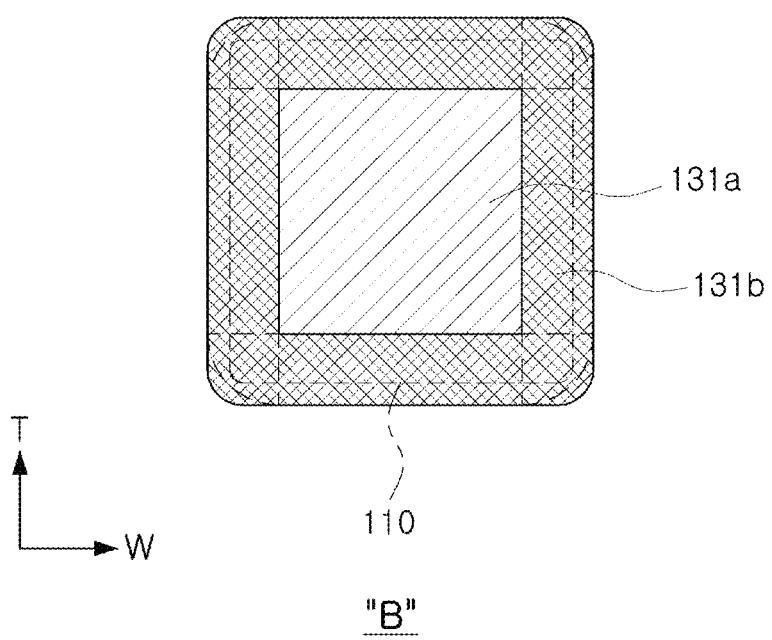
Figure 3C:
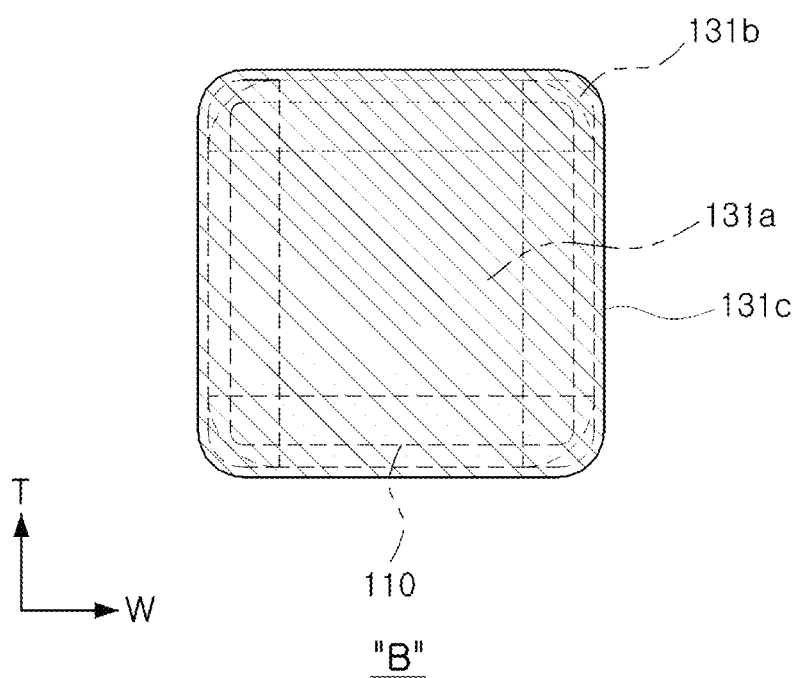

Referring to FIGS. 3A through 3C, regions of the first and second base electrodes 131a and 132a in which the first and second conductive layers 131b and 132b are not formed may have a tetragonal shape when viewed in the direction of end surfaces of the ceramic body 110.

According to an exemplary embodiment of the present disclosure, the first and second conductive layers 131b and 132b, which are formed in regions in which the thickness is relatively thin to thereby be vulnerable to the plating solution in the regions of the first and second base electrodes 131a and 132a formed on the ceramic body 110, may be formed on corner parts represented by horizontal and vertical lines when viewed in the direction of end surfaces of the ceramic body 110.

In this case, since the first and second conductive layers 131b and 132b may be formed by a printing method as described below, the first and second conductive layers 131b and 132b may be formed on the upper and lower cover layers and a margin part in the width direction, except for the active layer A, such that the regions of the first and second base electrodes 131a and 132a in which the first and second conductive layers 131b and 132b are not formed may have a tetragonal shape when viewed in the direction of end surfaces of the ceramic body.

In the case in which the regions of the first and second base electrodes 131a and 132a in which the first and second conductive layers 131b and 132b are not formed have the tetragonal shape as described above, a corner coverage area of the external electrode may be uniform as compared to a circular shape, such that the effect of preventing infiltration of the plating solution may be relatively more excellent.

Figure 3D:
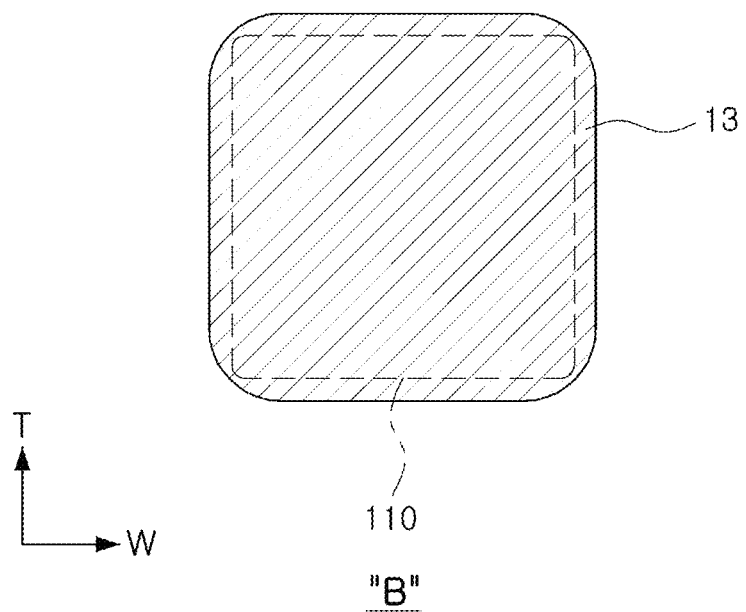
Figure 3E:
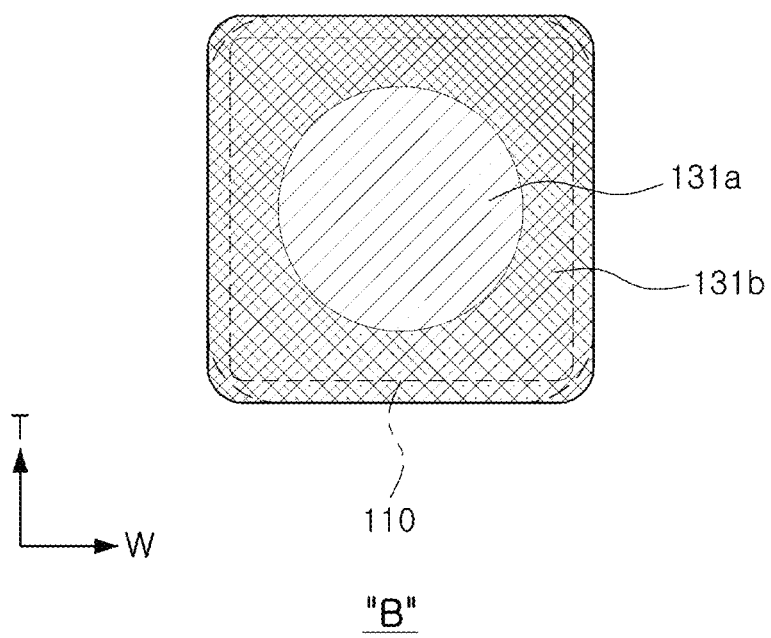
Figure 3F:
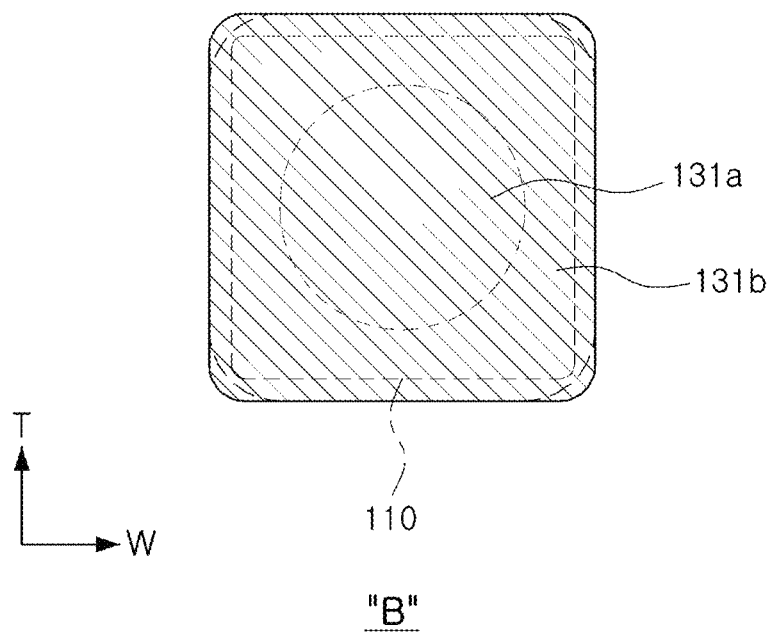

Referring to FIGS. 3D through 3F, in a multilayer ceramic capacitor according to another exemplary embodiment of the present disclosure, regions of the first and second base electrodes 131a and 132a in which the first and second conductive layers 131b and 132b are not formed may have a circular shape when viewed in the direction of end surfaces of a ceramic body 110.

Since the first and second conductive layers 131b and 132b may be formed by a printing method, the first and second conductive layers 131b and 132b may be formed on the upper and lower cover layers and a margin part in the width direction, except for the active layer A, such that the regions of the first and second base electrodes 131a and 132a in which the first and second conductive layers 131b and 132b are not formed may have the circular shape.

In the case in which the regions of the first and second base electrodes 131a and 132a in which the first and second conductive layers 131b and 132b are not formed have the circular shape as described above, an effect of preventing infiltration of the plating solution may be relatively excellent.

A multilayer ceramic electronic part according to another exemplary embodiment of the present disclosure may include: a ceramic body 110 including dielectric layers 111; an active layer A including a plurality of first and second internal electrodes 121 and 122 formed to be alternately exposed to both end surfaces of the ceramic body 110, having the dielectric layer therebetween, to thereby form capacitance; upper and lower cover layers C formed on upper and lower portions of the active layer A; and first and second external electrodes 131 and 132 formed on both end portions of the ceramic body 110, wherein in a cross section of the ceramic body 110 in a length-thickness (L-T) direction, the first external electrode 131 includes a first base electrode 131a, a first conductive layer 131b formed on the first base electrode 131a at a corner portion of the ceramic body 110, and a first terminal electrode 131c formed on the first base electrode 131a and the first conductive layer 131b, and the second external electrode 132 includes a second base electrode 132a, a second conductive layer 132b formed on the second base electrode 132a at the corner portion of the ceramic body 110, and a second terminal electrode 132c formed on the second base electrode 132a and the second conductive layer 132b, the first and second base electrodes 131a and 132a containing a conductive metal and glass, and the first and second conductive layers 131b and 132b containing a larger amount of a conductive metal and a smaller amount of glass as compared to the first and second base electrodes 131a and 132a.

Regions of the first and second base electrodes 131a and 132a in which the first and second conductive layers 131b and 132b are not formed may have a tetragonal shape when viewed in the direction of end surfaces of the ceramic body 110.

The conductive metal may be one or more selected from a group consisting of copper (Cu), nickel (Ni), silver (Ag), and sliver-palladium (Ag—Pd).

In describing features of the multilayer ceramic electronic part according to this exemplary embodiment of the present disclosure, a description overlapped with the description of the multilayer ceramic electronic part according to the above mentioned exemplary embodiment of the present disclosure will be omitted.

Hereinafter, a method of manufacturing a multilayer ceramic electronic part, for example, a multilayer ceramic capacitor, according to another exemplary embodiment of the present disclosure will be described in detail, but the present disclosure is not limited thereto.

First, the ceramic body 110 including the dielectric layer 111 and the first and second internal electrodes 121 and 122 disposed to face each other, having the dielectric layer 111 therebetween, may be prepared.

The dielectric layer 111 may be formed of a ceramic green sheet prepared to have a thickness of several μm by applying a slurry formed by mixing a powder such as a barium titanate (BaTiO$_3$) powder, or the like, with a ceramic additive, an organic solvent, a plasticizer, a binder, and a dispersing agent using a basket mill onto a carrier film to then be dried.

Then, an internal electrode layer may be formed using a conductive paste by dispensing the conductive paste on the green sheet and moving a squeegee in one side direction.

Here, the conductive paste may be formed of one or more materials of a noble metal material such as silver (Ag), lead (Pb), platinum (Pt), or the like, nickel (Ni), and copper (Cu) or may be formed of a mixture of at least two materials thereof.

After the internal electrode layer is formed as described above, a multilayer body may be formed by separating the green sheet from the carrier film and then stacking a plurality of green sheets on each other, respectively, so as to be overlapped with each other.

Then, a ceramic body may be manufactured by compressing the green sheet multilayer body at a relatively high temperature and high pressure and then cutting the compressed sheet multilayer body so as to have a predetermined size in a cutting process.

Next, first and second external electrodes 131 and 132 may be formed on end portions of the ceramic body 110 so as to be electrically connected to the first and second internal electrodes 121 and 122.

In a process for forming the first and second external electrodes 131 and 132, firstly, a conductive paste for an external electrode containing a conductive metal and glass may be applied onto both end portions of the ceramic body, thereby forming first and second base electrodes.

The conductive metal may be one or more selected from a group consisting of copper (Cu), nickel (Ni), silver (Ag), and sliver-palladium (Ag—Pd).

Then, a conductive paste containing a larger amount of a conductive metal and a smaller amount of glass as compared to the first and second base electrodes may be applied onto the first and second base electrodes at a corner part of the ceramic body, thereby forming the first and second conductive layers.

The contents of the conductive metal and the glass contained in the first and second base electrodes and the first and second conductive layers are not particularly limited. In the case in which a content ratio of the conductive metal to the glass contained in the first and second base electrodes is 6:4, a content ratio of the conductive metal to the glass contained in the first and second conductive layers may be 8:2.

Then, first and second terminal electrodes may be formed by plating on the first and second base electrodes and the first and second conductive layers, respectively.

The first and second terminal electrodes are not particularly limited as long as they are plating layers, and may be, for example, a nickel/tin layer.

Finally, a multilayer ceramic capacitor may be manufactured by sintering the ceramic body.

Other details except for the above-mentioned method are the same as those in a general method of manufacturing a multilayer ceramic capacitor.

Figure 4A:
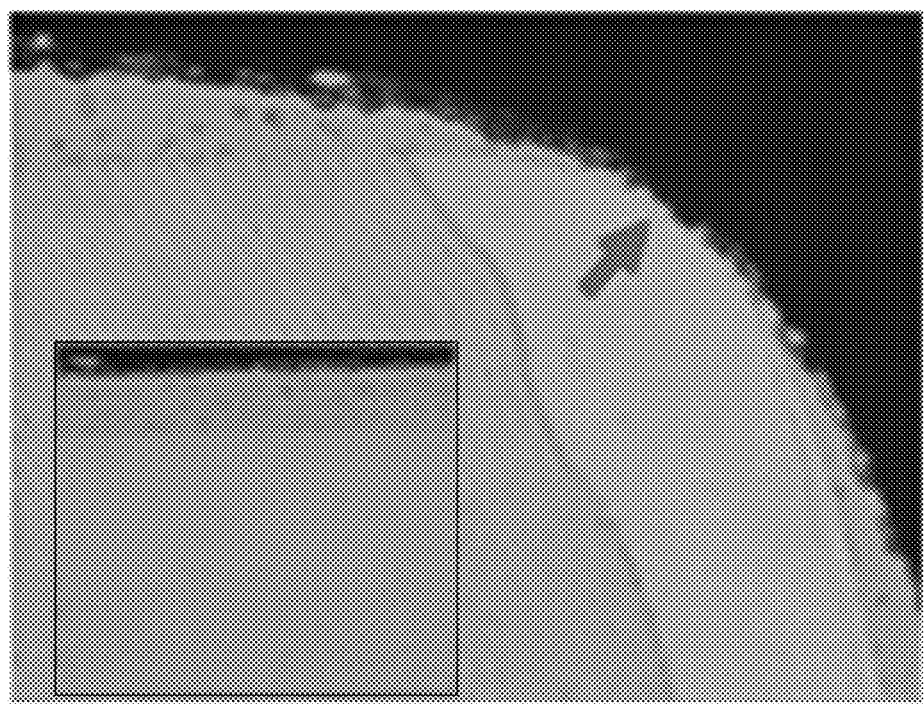
FIGS. 4A and 4B are views, respectively, scanning electron microscope (SEM) photographs of cross sections of external electrodes of multilayer ceramic capacitors according to Inventive Example and Comparative Example.
Figure 4B:
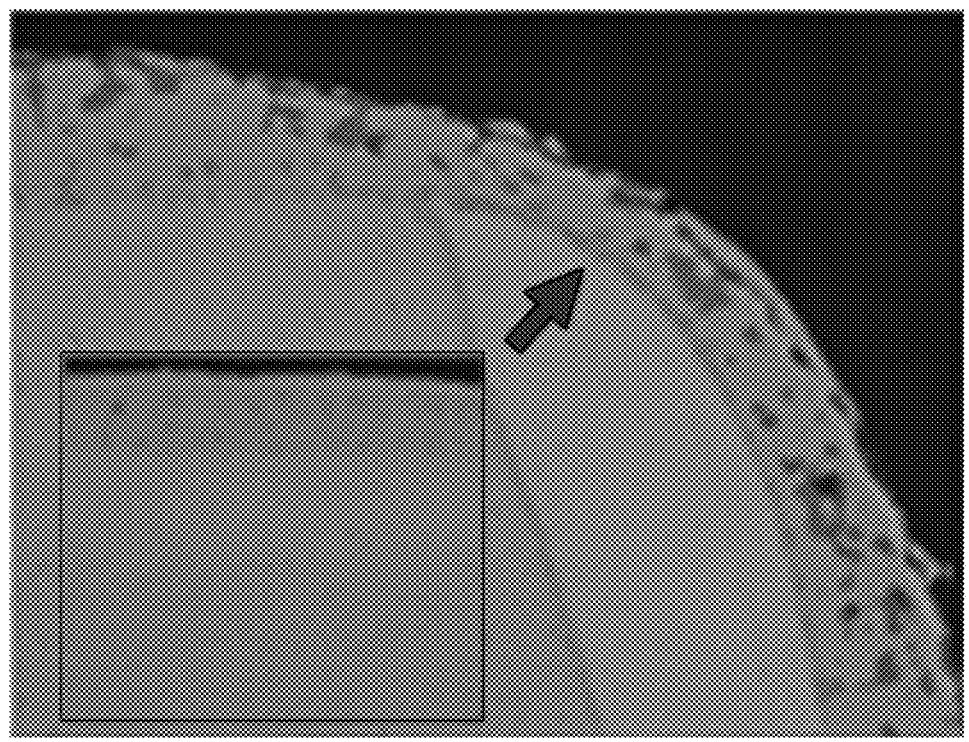

FIGS. 4A and 4B are views, respectively, scanning electron microscope (SEM) photographs of cross sections of external electrodes of multilayer ceramic capacitors according to Inventive Example and Comparative Example.

Referring to FIGS. 4A and 4B, it may be appreciated that in the case of an external electrode of a multilayer ceramic capacitor according to the Comparative Example of the present disclosure (FIG. 4A), a thickness of a corner part is relatively thin, and in the case of an external electrode of a multilayer ceramic capacitor according to the Inventive Example (FIG. 4B), since a thickness of a corner part is uniform as compared to a thickness of other regions, the multilayer ceramic capacitor having excellent reliability may be implemented by preventing a moisture resistance property from being deteriorated by infiltration of the plating solution.

As a result, according to an exemplary embodiment of the present disclosure, the first external electrode includes the first conductive layer formed on the first base electrode at the corner part of the ceramic body, and similarly, the second external electrode includes the second conductive layer formed on the second base electrode at the corner part of the ceramic body, such that the multilayer ceramic electronic part having excellent reliability may be implemented.

For example, according to the present disclosure, a sealing property of the chip may be improved, and at the same time, the thickness of the external electrode may not be increased, whereby the multilayer ceramic electronic part having excellent reliability, high capacitance and a small size may be implemented.

Board Having Multilayer Ceramic Electronic Part Mounted Thereon

Figure 5:
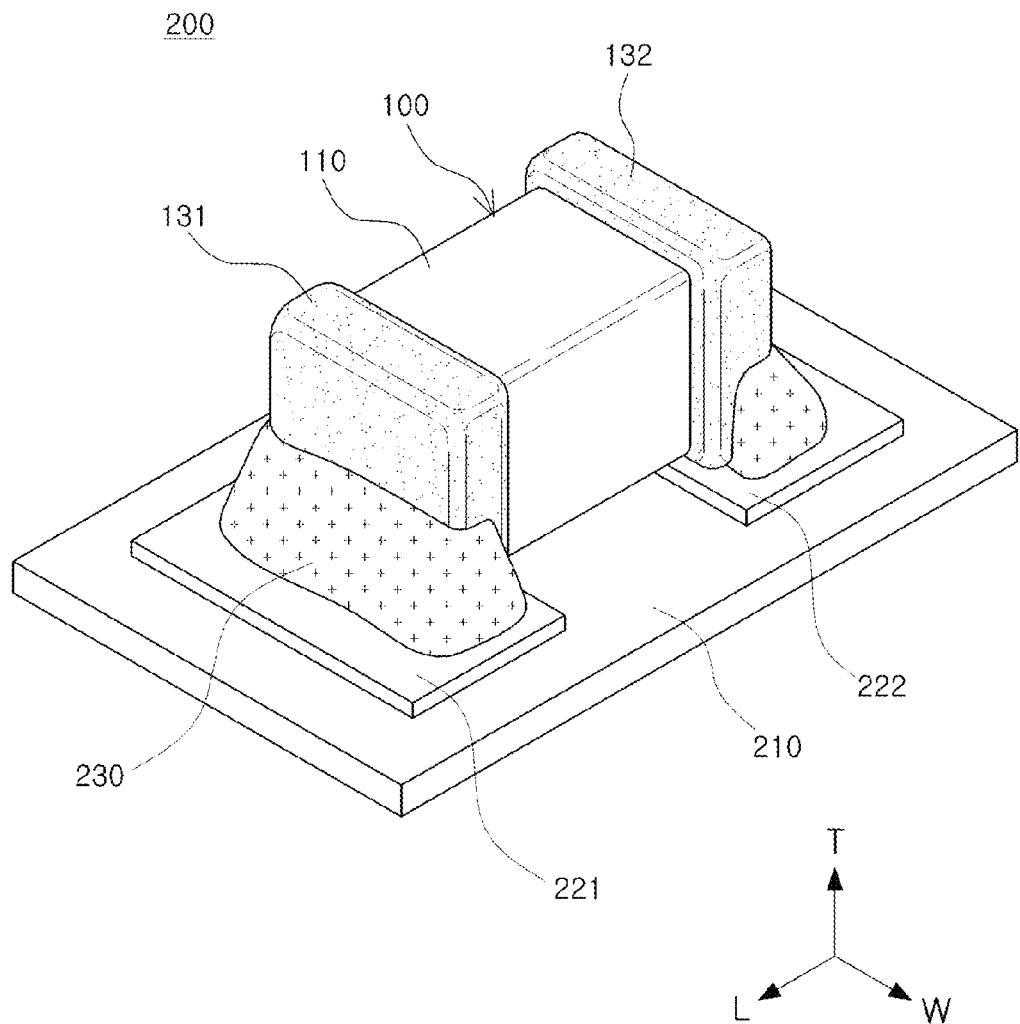
FIG. 5 is a perspective view showing a form in which the multilayer ceramic capacitor of FIG. 1 is mounted on a printed circuit board.

FIG. 5 is a perspective view showing a form in which the multilayer ceramic capacitor of FIG. 1 is mounted on a printed circuit board.

Referring to FIG. 5, a board 200 having a multilayered ceramic capacitor 100 mounted thereon according to this exemplary embodiment of the present disclosure may include a printed circuit board 210 on which the multilayer ceramic capacitor 100 is horizontally mounted, and first and second electrode pads 221 and 222 formed on the printed circuit board 210 to be spaced apart from each other.

In this case, the multilayer ceramic capacitor 100 may be electrically connected to the printed circuit board 210 by soldering 230 in a state in which a lower cover layer is disposed downwardly and first and second external electrodes 131 and 132 are positioned on the first and second electrode pads 221 and 222 so as to contact each other, respectively.

Regions of the first and second base electrodes 131a and 132a in which the first and second conductive layers 131b and 132b are not formed may have a tetragonal shape when viewed in the direction of end surfaces of the ceramic body 110.

As set forth above, according to exemplary embodiments of the present disclosure, the conductive layer is additionally formed in a corner part of the ceramic body to improve corner coverage performance of external electrodes, thereby implementing multilayer ceramic electronic parts having improved reliability.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic part comprising:
a ceramic body including dielectric layers;
an active layer including a plurality of first and second internal electrodes formed to be alternately exposed to both end surfaces of the ceramic body, having the dielectric layer therebetween, to thereby form capacitance;
upper and lower cover layers formed on upper and lower portions of the active layer; and
first and second external electrodes formed on both end portions of the ceramic body,
wherein in a cross section of the ceramic body in a length-thickness direction, the first external electrode includes a first base electrode, a first conductive layer formed on the first base electrode at a corner portion of the ceramic body, and a first terminal electrode formed on the first base electrode and the first conductive layer, and the second external electrode includes a second base electrode, a second conductive layer formed on the second base electrode at a corner portion of the ceramic body, and a second terminal electrode formed on the second base electrode and the second conductive layer, the first and second conductive layers being positioned outside the active layer in a thickness direction of the ceramic body.

2. The multilayer ceramic electronic part of claim 1, wherein regions of the first and second base electrodes in which the first and second conductive layers are not formed have a tetragonal shape when viewed in a direction of an end surface of the ceramic body.

3. The multilayer ceramic electronic part of claim 1, wherein the first and second base electrodes contain one or more conductive metals selected from a group consisting of copper (Cu), nickel (Ni), silver (Ag), and sliver-palladium (Ag—Pd), and glass.

4. The multilayer ceramic electronic part of claim 3, wherein the first and second conductive layers contain a larger amount of a conductive metal and a smaller amount of glass as compared to the first and second base electrodes.

5. The multilayer ceramic electronic part of claim 1, wherein the first and second conductive layers contain a conductive resin.

6. The multilayer ceramic electronic part of claim 5, wherein the conductive resin contains one or more conductive metals selected from a group consisting of copper (Cu), nickel (Ni), silver (Ag), and sliver-palladium (Ag—Pd), and an epoxy resin.

7. A multilayer ceramic electronic part comprising:
a ceramic body including dielectric layers;
an active layer including a plurality of first and second internal electrodes formed to be alternately exposed to both end surfaces of the ceramic body, having the dielectric layer therebetween, to thereby form capacitance;
upper and lower cover layers formed on upper and lower portions of the active layer; and
first and second external electrodes formed on both end portions of the ceramic body,
wherein in a cross section of the ceramic body in a length-thickness direction, the first external electrode includes a first base electrode, a first conductive layer formed on the first base electrode at a corner portion of the ceramic body, and a first terminal electrode formed on the first base electrode and the first conductive layer, and the second external electrode includes a second base electrode, a second conductive layer formed on the second base electrode at a corner portion of the ceramic body, and a second terminal electrode formed on the second base electrode and the second conductive layer, the first and second base electrodes containing a conductive metal and glass, and the first and second conductive layers containing a larger amount of a conductive metal and a smaller amount of glass as compared to those of the first and second base electrodes.

8. The multilayer ceramic electronic part of claim 7, wherein regions of the first and second base electrodes in which the first and second conductive layers are not formed have a tetragonal shape when viewed in a direction of an end surface of the ceramic body.

9. The multilayer ceramic electronic part of claim 7, wherein the conductive metal is one or more selected from a group consisting of copper (Cu), nickel (Ni), silver (Ag), and sliver-palladium (Ag—Pd).

10. A board having a multilayer ceramic electronic part mounted on the board, the board comprising:
a printed circuit board having first and second electrode pads formed on the printed circuit board; and
the multilayer ceramic electronic part of claim 1 mounted on the printed circuit board.

11. The board of claim 10, wherein regions of the first and second base electrodes in which the first and second conductive layers are not formed have a tetragonal shape when viewed in a direction of an end surface of the ceramic body.

12. A board having a multilayer ceramic electronic part mounted on the board, the board comprising:
a printed circuit board having first and second electrode pads formed on the printed circuit board; and
the multilayer ceramic electronic part of claim 7 mounted on the printed circuit board.

13. The board of claim 12, wherein regions of the first and second base electrodes in which the first and second conductive layers are not formed have a tetragonal shape when viewed in a direction of an end surface of the ceramic body.

* * * * *